United States Patent [19]

Maamari

[11] Patent Number: 5,418,792
[45] Date of Patent: May 23, 1995

[54] METHOD FOR THE SPEEDUP OF TEST VECTOR GENERATION FOR DIGITAL CIRCUITS

[75] Inventor: Fadi Maamari, Princeton, N.J.

[73] Assignee: AT&T Corp., Murray Hill, N.J.

[21] Appl. No.: 984,651

[22] Filed: Dec. 2, 1992

[51] Int. Cl.⁶ ............................................. G06F 11/00
[52] U.S. Cl. ..................... 371/23; 371/16.5; 371/19
[58] Field of Search ................. 371/27, 22.1, 23, 16.5, 371/19

[56] References Cited

U.S. PATENT DOCUMENTS

| 4,991,176 | 2/1991 | Dahbura et al. | 371/27 |
| 5,257,268 | 10/1993 | Agrawal et al. | 371/27 |
| 5,305,328 | 4/1994 | Motohara et al. | 371/22.1 |

OTHER PUBLICATIONS

"Test Generation Techniques for Sequential Circuits," by N. Gouders and R. Kaibel, published in *Proceedings of the IEEE VLSI Test Symposium*, pp. 221-226 (1991). (no month).

"The Back Algorithm for Sequential Test Generation," by W.—T. Cheng, published in the *Proceedings, International Conference on Computer Design*, at pp. 66-69 (Oct. 1988).

"GENTEST, an Automatic Test Generation System for Sequential Circuits," by W. T. Cheng and T. J. Chakraborty, published in the IEEE Transactions, Computers, vol. 22, No. 4, pp. 43-49 (Apr. 1989).

*Primary Examiner*—Ellis B. Ramirez
*Assistant Examiner*—Thomas Peeso
*Attorney, Agent, or Firm*—Robert B. Levy

[57] ABSTRACT

The generation of a test for detecting faults in a circuit (10) can be speeded up by first selecting a successive one of a first set of faults for targeting and thereafter determining the effort required to detect a predetermined number of the first set of faults. Each of the remaining faults is then successively targeted, with the amount of effort spent to detect each of the remaining faults being adjusted in accordance with the amount of effort spent detecting the previously targeted fault. In each test cycle, faults that are untestable, or too difficult to detect during that cycle, are eliminated from consideration to improve the efficiency and speed of the test generation process.

10 Claims, 2 Drawing Sheets

METHOD FOR THE SPEEDUP OF TEST VECTOR GENERATION FOR DIGITAL CIRCUITS

TECHNICAL FIELD

This invention relates to a technique for improving the efficiency, and hence the speed, at which test vectors are generated for testing a digital electronic circuit.

BACKGROUND OF THE INVENTION

A digital electronic circuit is typically tested by successively launching each of a set of test vectors into the inputs(s) of the circuit and then monitoring the output response following receipt of each test vector. In practice, the test vectors are generated by an automatic test pattern generator which typically takes the form of a computer program executed by a conventional digital computer. Present-day automatic test pattern generators fix the maximum amount of effort (i.e., time) to be spent during a test generation cycle for generating a test (i.e., one or more test vectors) for each fault regardless of the fault difficulty. This often leads to inefficiency because allocating too large a maximum test vector generation effort will cause the test pattern generator to spend too much time attempting to generate a test for a fault that is too difficult to test. On the other hand, if the maximum allocated generation effort is too small, then a fault may go undetected because not enough effort was spent to generate a test for successfully detecting the fault, resulting in inadequate fault coverage.

Thus, there is a need for a method for speeding up the generation of test vectors to increase overall efficiency of the test vector generation process.

SUMMARY OF THE INVENTION

Briefly, a technique is provided for speeding up the generation of a test for testing a digital electronic circuit having a set of potential faults. At the outset, an initial allocated test generation effort value is established representing the amount of resources (i.e., time or backtracks) to be spent generating a test to detect each fault. Each of a first plurality of circuit faults is then successively selected, and for each such fault, the allocated initial effort is expended to generate a test to detect the fault. For each fault which is successfully targeted (i.e., a test has been generated which indeed detects the fault with no more than the allocated effort), the effort required to detect the fault is recorded. Additionally, for each successful test, it may also be desirable to perform a fault simulation for that test to determine which, if any, other faults are detected so that the faults can be eliminated from further consideration. Following the successful targeting of a prescribed number of selected faults, the test generation effort is adjusted in accordance with the maximum effort required to detect a fault. Each of the remaining faults not previously selected is then successively targeted in the same manner as each of the previously selected faults. Prior to successively targeting each remaining fault, the test generation effort is adjusted based on the effort required to generate a test to detect the previously targeted fault. If more than a small number of faults remain undetected after the last fault is targeted, the test generation effort is increased and the process of: (a) selecting a successive one of the remaining undetected faults, (b) adjusting the test generation effort in accordance with the effort expended to detect a previously selected fault, and (c) generating a test for the targeted fault, is repeated.

DETAILED DESCRIPTION

Figure 1:
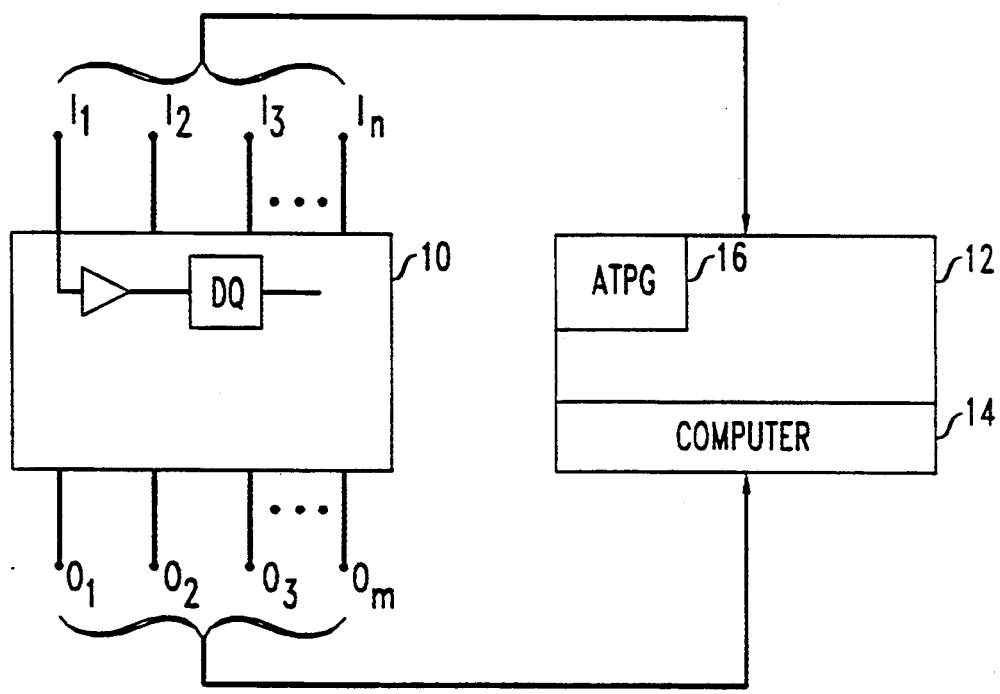
FIG. 1 is a block schematic diagram of a prior-art electronic circuit which is tested by test vectors generated by an automatic test pattern generator of the prior art.

FIG. 1 shows a prior-art digital electronic circuit 10, typically an integrated circuit, coupled to a prior-art automatic testing machine 12 which tests the circuit. In practice, the testing machine 12 includes a computer 14, or a similar data processing device, which tests the circuit 10 by launching a successive one of a set of test vectors into one or more of the circuit inputs $I_1, I_2, I_3 \ldots I_n$ where $n > 1$. In response to each test vector launched into one or more of its inputs $I_1, I_2, I_3 \ldots I_n$, the circuit 10 generates a response at one or more of its outputs $O_1, O_2, O_3 \ldots O_m$ where $m > 1$. The responses of the circuit 10 are received at the computer 14 of the testing machine 12 for analysis to determine if the circuit is faulty.

The vectors successively launched into the circuit 10 are typically generated by way of an Automatic Test Pattern Generator (ATPG) 16, which, in practice, takes the form of a software program executed by the computer 14. Computer programs for generating test vectors are well known in the art. In the preferred embodiment, the ATPG 16 comprises the program GENTEST, available from AT&T, Warren, N.J. Other automatic test pattern generation software may be used in place of GENTEST. Note that generation of the pattern of test vectors, by way of the automatic test pattern generator 14, can be performed in advance of the actual testing, either by the testing machine 12 or by a separate data processor (not shown) and then down-loaded to the testing machine during the testing interval.

The automatic test pattern generator 16 of FIG. 1 operates to generate a test (i.e., a set or pattern of test vectors) for the circuit 10 in accordance with each set of potential circuit faults, typically obtained from a description of the circuit, using a list of nets or the like. Once a set of potential faults is obtained, then an attempt is made to generate a test for detecting each potential fault of the circuit 10. Various algorithms exist for generating a test to detect a potential fault once the fault type is known. See, for example, the paper "The BACK Algorithm for Sequential Test Generation" by W. T. Cheng, *International Conference on Computer Design*, October, 1988, at pages 66–69, herein incorporated by reference, which discusses one possible algorithm for sequential test pattern generation.

It is generally useful to perform automatic test pattern generation in cycles. Initially, a prescribed amount of effort (as typically measured in computer time) is expended to generate a test to test (detect) a successive one of the set of potential circuit faults. After an attempt is made to successively detect each fault, the amount of effort is increased, and those faults not previously detected during the previous cycle are successively targeted during the next cycle. That is, an attempt is made to generate a test for each successive fault not previously detected. At the end of the cycle, the amount of effort is increased once again and another cycle is executed. The number of cycles is determined by how much effort is to be spent to achieve a desired level of fault coverage.

While performing automatic test generation in cycles has certain advantages, such as the ability to detect difficult faults at a much smaller overhead cost than other approaches, a certain amount of waste (i.e., inefficiency) is inherent in generating a test in this manner. Typically, for hard faults, much of the effort spent targeting hard faults in early cycles is wasted, either because such a hard fault was ultimately tested by a test for another fault or the fault was simply too difficult to detect.

Figure 2:
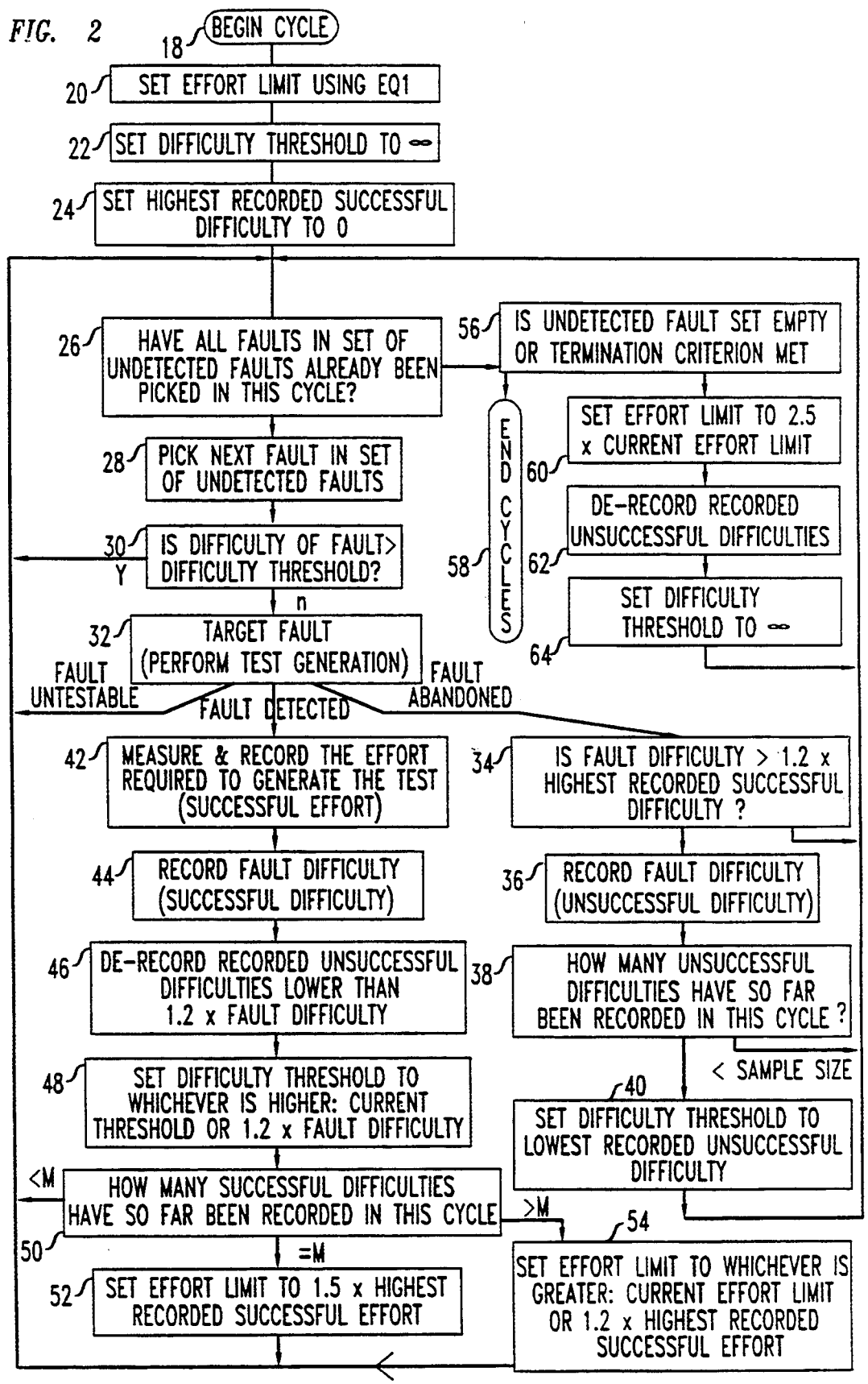
FIG. 2 is a flowchart representation of a method, in accordance with the invention, for speeding up the process by which the automatic test pattern generator for FIG. 1 generates test vectors.

Referring now to FIG. 2, there is shown a flowchart of a method for automatic test pattern generation, in accordance with the invention, which affords the advantage of increased speed and greater efficiency. In describing the method of FIG. 2, it is assumed that each potential fault of the circuit 10 for which a test is to be generated has already been established by techniques which are well known in the art. Referring to FIG. 2, the automatic test pattern generation method of the invention is begun by executing step 18 during which a first cycle of the test generation process is started, typically by initializing various variables.

Following step 18, step 20 is executed and an initial effort value (E) is set, representing the amount of effort (e.g, the amount of time) that will be allocated to attempt to generate a test for a successive fault during a first iteration or cycle. In practice, the initial effort value (E) is set in accordance with the following relationship:

$$E = \min[(aN^2 + bS), c] \quad (1)$$

where N is the number of nodes in the circuit 10 and S is the number of flip-flops or sequential elements (not shown) in the circuit. The terms a,b and c are constants whose values are selected in accordance with the units in which E is measured.

In the illustrated preferred embodiment, E is measured in time (seconds) and a,b and c are nominally selected as 0.05, 5 and 0.5, respectively. Rather than measure E in terms of seconds, E could also be measured in terms of the number of "backtracks" or test point decision reversals that occur as a result of a conflict during the search for a test for a particular fault. The number of backtracks is usually proportional to the amount of time spent searching although such is not always the case. In the event that E is measured in terms of backtracks, then different values for a,b and c would be selected.

Following step 20, step 22 is executed whereupon an initial difficulty threshold is established. The difficulty threshold represents the maximum level of difficulty of a fault for which effort (i.e., time) will be spent generating a test to attempt to detect a fault. If the fault has a greater difficulty, then the fault is abandoned, as will be discussed below. While the exact level of difficulty of a fault is impossible to know in advance, it is possible to obtain an estimate of the amount of effort that will be required to test the fault by the use of some test generation algorithms. For example, the previously referenced BACK algorithm provides a measure of the difficulty in propagating the fault to each point in the circuit 10. The difficulty in propagating the fault to the lowest order output of the circuit 10 has been found to be a good measure of the fault difficulty. The maximum difficulty threshold is set at infinity during step 22 so that during the first test generation cycle (the initial execution of the program of FIG. 2), even the most difficult fault is initially considered for detection.

After step 22, step 24 is executed and a variable, designated as "highest recorded successful difficultly," which represents the difficulty level of the most difficult fault thus far successfully detected, is initialized at zero. As will be appreciated, the highest recorded successful difficulty serves as a running record of the difficulty (i.e., hardness) of the hardest fault thus far detected.

Following step 24, a check is made during step 26 as to whether all faults in a set of undetected faults have already been picked during the current test generation cycle. During the first cycle of the automatic test pattern generation method of FIG. 2 (i.e., the initial execution of step 26), all of the potential faults in the circuit 10 have yet to be detected. However, as will become better understood hereinafter, one or more of the faults will likely either be detected during each successive test pattern generation cycle or be proven untestable, i.e., no test exists. The faults that have been detected during a preceding cycle or have been proven untestable are no longer of interest during a current cycle. Therefore, during each succeeding cycle, only faults that have not yet been successfully detected or proven untestable are of concern.

If, during step 26, a determination is made that all of the undetected faults have not been selected during the current cycle (as will certainly be true during the first cycle), then a successive one of the undetected faults is picked for detection (step 28). Following step 28, a check is made (step 30) as to whether the fault just picked has a difficulty greater than the difficulty threshold. If, during step 30, a determination is made that the difficulty of the fault exceeds the difficulty threshold, then step 26 and those following it are re-executed. The benefit in branching to step 26 under this condition is that effort is not wasted during early test cycles in detecting very difficult faults.

Otherwise, when the fault has a lower difficulty than the difficulty threshold, as will invariably be the case at the beginning of each cycle, the fault is targeted during step 32. In other words, a test is generated to detect the selected fault in accordance with a test pattern generation algorithm, such as the previously referenced BACK algorithm. During step 32 the process of generating a test to detect the selected fault is carded out until the allocated maximum test generation effort is expended (i.e., the test generation interval has elapsed) or until the fault is either successfully tested or proven unrestable, whichever occurs first. As step 32 is being carried out, the amount of effort being expended (i.e., the amount of time spent in attempting to detect the fault) is monitored.

At the completion of step 32, there are three possible outcomes. One possible outcome is that the fault may be found untestable before the test generation effort allocated to detect the fault has been expended. In other words, no test can be generated which could detect the fault. Most test generation algorithms, such as the previously referenced BACK algorithm, have the capability of determining whether a fault is untestable, although the algorithm may not be able to do so for many cycles. If the selected fault is determined to be untestable during a particular cycle, then step 26 and those following it are re-executed. In this way, if the fault is deemed untestable, no further effort is expended and another fault is selected.

Another possible outcome during execution of step 32 is that the fault is found to be too difficult to test during the allotted test generation interval and therefore must be abandoned, at least until another cycle. Note that while the fault cannot be tested during the currently allotted interval, the fault has not yet been deemed untestable altogether. In fact, the fault may be testable if more effort (i.e., time) is allotted. If, after step 32, the presently selected fault has been found to be too difficult to test during the allotted interval, yet the fault has not been found untestable, then step 34 is executed. During step 34 a check is made whether the difficulty of the presently selected fault exceeds the highest recorded fault difficulty (i.e., the most difficult fault thus far detected) by an amount equal to or greater than a predetermined factor, typically chosen equal to 1.2. If the difficulty of the presently selected fault does not exceed the highest recorded fault difficulty thus far by at least the predetermined factor, then step 26 and those following it are re-executed. Unless the fault difficulty is significantly greater than the highest recorded fault difficulty, it is thus likely that such a fault is detectable with the allotted test generation effort.

When the fault difficulty is greater than the highest recorded difficulty, then the difficulty of the presently selected fault is recorded as an unsuccessful fault difficulty (step 36). After step 36, a determination is made as to how many faults have been unsuccessfully targeted during the current cycle (step 38). If the number of such unsuccessfully targeted faults is less than a predetermined sample size, say five, then step 26 and those following it are re-executed. Otherwise, step 40 is executed, and the difficulty threshold, initially set to infinity during step 22 or during a later step (step 64) described hereinafter, is reset to the lowest recorded unsuccessful difficulty, as recorded during step 36. After step 40, step 26 and those following it are re-executed. The purpose in executing steps 34–40 is to provide a mechanism to avoid targeting faults having a difficulty level too high for the current cycle. In this way, effort (i.e., time) is not wasted targeting faults that require more effort than has been allocated for the current cycle.

Returning to step 32, rather than the fault being found untestable, or being too difficult during the current cycle so as to be abandoned, the fault may indeed be detected. Should the fault be detected prior to the expiration of the allotted test generation interval initially established during step 20, then step 42 is executed and the amount of effort (i.e., the amount of time spent) in generating a test to successfully detect the fault, which was monitored during step 32, is recorded. Next, step 44 is executed and the difficulty (i.e., the hardness) of the just-detected fault is recorded. At the outset of the first cycle (i.e., the very first iteration of step 44), the initial value of the highest recorded successful difficulty is zero since no previous fault has yet been detected. During the first execution of step 44, the highest recorded successful difficulty value will necessarily change. However, as another successful difficulty is recorded during step 44 beyond the first execution of that step, the highest recorded successful difficulty may change.

During the execution of either of steps 42 or 44, it may be desirable to perform a fault simulation for a successful test to determine which other faults (if any) can be detected by such a test. Any such other faults detectable by this test are then eliminated from further consideration. Fault simulation requires much less effort than test generation, and thus, it is desirable to determine all of the faults that are detectable by a test rather than to perform test generation for each fault.

Next step 46 is executed, at which time, each unsuccessful difficulty recorded during a previous execution of step 36 is de-recorded or erased if the recorded unsuccessful difficulty is less than a selected multiple of the fault difficulty, the multiple typically being selected equal to 1.2. In erasing the previously recorded, unsuccessful difficulty value, it is presumed that a fault which is easier or less than 20% harder than that which has been already detected is likely to be detected with a similar level of effort.

Step 50 is executed after step 48, whereupon a check is made as to how many successful difficulties have been recorded during the current cycle. If the number of recorded successful difficulties, (i.e., the number of successfully detected faults) is less than a predetermined sample size M (where M is typically 10), then program execution branches back to step 26 and another successive fault is targeted in the manner described previously.

When the number of successfully recorded difficulties exactly equals the sample size M, then step 52 is executed and the test generation effort level, previously set in accordance with eq. 1 during step 20, is now reset to a predetermined multiple (typically 1.5) of the highest previously recorded successful effort. Following step 50, step 26 and those following it are re-executed. The rationale for adjusting the test generation effort during step 52 is that the highest test generation effort expended thus far to detect the small sample of faults is a good measure of the effort likely to be required to test each of the remaining faults. To provide some increased level of confidence, the highest recorded effort is scaled by a multiple, typically 1.5, in order to obtain a new effort value.

If, during step 50, the number of successful difficulties (i.e., the number of successfully detected faults) exceeds the sample size of M, then step 54 is executed. During step 54, the previously set effort limit is reset to the greater of the current effort limit (as possibly reset during a previous execution of step 50) or a predetermined multiple (e.g. 1.2) of the highest recorded effort limit. After step 54, step 26 and those following it are re-executed. As may be appreciated, the test generation effort is set differently during step 54 than during step 52. The reason for doing so is to provide for a mechanism for adjusting the effort value upwards if the last selected fault required a level of effort close to the allocated limit. The allocated level of effort can be adjusted downwards only during step 52, once per cycle.

Eventually, when step 26 has been executed a sufficient number of times, all of the undetected faults not previously picked will have been selected. Under this condition, step 56 is executed and a check is made whether the fault set is indeed empty or another termination criterion has been met. If so, step 58 is executed and no further test pattern generation cycles are carded out.

When the fault set is not empty, or the other termination criterion is not met, then step 60 is executed and the effort limit is set to a predetermined multiple (e.g., 2.5) of the current effort limit for a new test cycle. The rationale for increasing the effort limit is that more effort (i.e., more time) is likely needed to detect the faults previously selected but not yet detected. Following step 60, step 62 is executed and the previously recorded unsuccessful difficulties are de-recorded or erased. In this way, upon the start of the next test generation cycle (i.e., the next execution of step 26 and those following it), the unsuccessful fault hardness is established anew. Step 64 is then executed and the difficulty threshold is reset to infinity. Thereafter, step 26 and those following are re-executed to begin another test generation cycle.

The above-described test generation technique affords two distinct advantages. First, the amount of effort spent in targeting faults is dynamically set, first, in accordance with an initial small sample, and thereafter, in accordance with the amount of effort spent targeting the previously selected fault. In this way, the efficiency of the process is significantly increased. The second advantage afforded by the instant technique is that the technique tracks the successes and failures of detecting each fault and uses such information to dynamically establish a hardness threshold. Faults easier than the current hardness threshold are targeted during the current cycle. Those faults which are harder than the currently established hardness threshold are not targeted during the current cycle, thereby increasing the efficiency, and hence the speed, of the test pattern generation process.

The foregoing discloses a technique for generating test vectors for detecting faults in a circuit 10.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for speeding up the generation of a test for detecting a set of faults in a digital circuit by dynamically varying how much effort is expended to generate the test, comprising:
   (a) establishing an allocated test generation effort;
   (b) selecting one of the set of faults for detection;
   (c) generating a test for the purpose of successfully detecting the fault while monitoring the effort spent at generating the test;
   (d) recording the amount of effort actually-expended to generate the test, if the actually-expended effort is not greater than the allocated test generation effort amount, when a test that successfully detects the selected fault is found;
   (e) repeating the steps of (b)–(d) until a test has been found to successfully test a separate one of a prescribed number of faults in the set;
   (f) dynamically adjusting the allocated test generation effort in accordance with the highest of the recorded efforts by increasing the test generation effort when the highest of the recorded efforts is above a prescribed value and by decreasing the test generation effort when the highest of the recorded efforts is below the prescribed value;
   (g) selecting one of the faults not previously successfully detected;
   (h) generating a test for the selected fault while expending the now-adjusted allocated test generation effort, and if the test does successfully test the fault, then recording the actual test generation effort expended to generate the test;
   (i) dynamically adjusting the allocated amount of effort expended to generate a test in accordance with the recorded amount of actually-expended effort;
   (j) repeating the steps of (g)–(h) until all of the remaining faults in the set have been selected; and
   (k) increasing the test generation effort by a prescribed amount and repeating the steps of (e)–(j) until at least a predetermined number of faults have been successfully detected.

2. The method according to claim 1 wherein the test generation effort corresponds to a maximum allowable time interval for generating a test.

3. The method according to claim 1 wherein the allocated test generation effort is adjusted during step (f) in accordance with a first prescribed multiple of the highest actual test effort.

4. The method according to claim 3 wherein the first prescribed multiple equals 1.5.

5. The method according to claim 1 wherein the test generation effort is increased during step (h) in accordance with the greater of: (1) the test generation effort amount, as last adjusted, and (2) the product of a second prescribed multiple and the highest recorded test generation effort.

6. The method according to claim 5 wherein the second prescribed multiple equals 1.2.

7. The method according to claim 1 further including the steps of:
   (l) initially establishing a difficulty threshold, representing a maximum level difficulty threshold for a fault above which a test will not be generated therefor, prior to step (b);
   (m) initializing a recorded unsuccessful fault difficulty value to zero prior to step (b);
   (n) comparing, after selecting the next fault during step (b), the difficulty threshold to a difficulty value associated with how much effort is required to successfully test said selected fault;
   (o) re-executing step (b) when the difficulty of the currently selected fault exceeds the initially established difficulty threshold; otherwise
   (p) comparing, for said selected fault when no test is generated therefor, whether the difficulty of the fault exceeds a fourth predetermined multiple of a highest one of the recorded unsuccessful difficulty value and, if not, then re-executing step (b); otherwise
   (q) recording the difficulty value of the selected fault as unsuccessful;
   (r) readjusting the difficulty threshold value to a lowest recorded unsuccessful fault difficulty value if a predetermined number of unsuccessful difficulties have been recorded thus far before re-executing step (b).

8. The method according to claim 7 wherein the fourth predetermined multiple equals 1.2.

9. The method according to claim 7 further including the steps of:
   (s) de-recording the recorded unsuccessful fault difficulty value after adjusting the amount of test generation effort and before re-executing steps (e)–(j); and
   (t) re-setting the difficulty threshold to its initial value after adjusting the amount of test generation effort and before re-executing steps (e)–(j).

10. The method according to claim 1 further including the steps of:
    performing a fault simulation for each test found to successfully detect a fault to determine which other faults (if any) will be detected by the test; and
    eliminating those faults determined by fault simulation to be detectable from further consideration.

* * * * *